(12) United States Patent
Wu et al.

(10) Patent No.: US 6,730,582 B2
(45) Date of Patent: May 4, 2004

(54) TRANSISTOR CIRCUIT WITH VARYING RESISTANCE LIGHTLY DOPED DIFFUSED REGIONS FOR ELECTROSTATIC DISCHARGE (ESD) PROTECTION

(75) Inventors: Zhiqiang Wu, Plano, TX (US); David B. Scott, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/020,687

(22) Filed: Dec. 14, 2001

(65) Prior Publication Data

US 2002/0079546 A1 Jun. 27, 2002

Related U.S. Application Data

(60) Provisional application No. 60/257,489, filed on Dec. 21, 2000.

(51) Int. Cl.[7] .............................................. H01L 21/425
(52) U.S. Cl. .................. 438/527; 438/299; 438/301; 438/303; 438/529
(58) Field of Search ................................ 438/299, 301, 438/303, 527, 529

(56) References Cited

U.S. PATENT DOCUMENTS

| 5,019,888 | A |   | 5/1991  | Scott et al.    |         |
|-----------|---|---|---------|-----------------|---------|
| 5,238,859 | A | * | 8/1993  | Kamijo et al.   | 438/304 |
| 5,246,872 | A | * | 9/1993  | Mortensen       | 438/200 |
| 5,508,212 | A | * | 4/1996  | Wang et al.     | 438/305 |
| 5,675,168 | A | * | 10/1997 | Yamashita et al.| 257/355 |
| 6,013,570 | A | * | 1/2000  | Yu et al.       | 438/595 |
| 6,215,156 | B1| * | 4/2001  | Yang            | 257/360 |
| 2002/0019104 | A1 | * | 2/2002 | Miyagi         | 438/307 |

FOREIGN PATENT DOCUMENTS

JP          8-172135 A  *  7/1996

OTHER PUBLICATIONS

JP 8–172135 English Language Abstract (Miyagi) Jul. 2,1996, [online], [retrieved on Nov. 13, 2002] Retrieved from the Industrial Property Digital Library of the Japanese Patent Office using internet <URL: http://www.ipdl.jpo.go.jp/homepg_e.ipdl>.*

* cited by examiner

*Primary Examiner*—Amir Zarabian
*Assistant Examiner*—Jeff Vockrodt
(74) *Attorney, Agent, or Firm*—Peter K. McLarty; W. James Brady, III; Frederick J. Telecky, Jr.

(57) ABSTRACT

A method of forming a transistor (70) in a semiconductor active area (78). The method forms a gate structure ($G_2$) in a fixed relationship to the semiconductor active area thereby defining a first source/drain region ($R_1$) adjacent a first gate structure sidewall and a second source/drain region ($R_2$) adjacent a second sidewall gate structure. The method also forms a lightly doped diffused region ($80_1$) formed in the first source/drain region and extending under the gate structure, wherein the lightly doped diffused region comprises a varying resistance in a direction parallel to the gate structure.

6 Claims, 6 Drawing Sheets

TRANSISTOR CIRCUIT WITH VARYING RESISTANCE LIGHTLY DOPED DIFFUSED REGIONS FOR ELECTROSTATIC DISCHARGE (ESD) PROTECTION

CROSS-REFERENCES TO RELATED APPLICATIONS

This application claims priority under 35 USC § 119(e)(1) of provisional application Ser. No. 60/257,489, filed Dec. 21, 2000.

STATEMENT REGARDING FEDERALLY SPONSORED RESEARCH OR DEVELOPMENT

Not Applicable.

BACKGROUND OF THE INVENTION

The present embodiments relate to electronic circuits and are more particularly directed to a metal oxide semiconductor ("MOS") transistor having a configuration for enhanced electrostatic discharge ("ESD") protection.

Many contemporary integrated circuits include two sets of transistors, where a first transistor set operates at a first operating voltage while a second transistor set operates at a second and different operating voltage. For example, in various modem circuits a first voltage is used for transistors implemented at the input/output ("I/O") level while a second and lower voltage is used for transistors implemented in the operational core of the circuit. In these cases, transistors suitable for use at the higher I/O voltages are required and, thus, the design of such transistors must take this factor into account.

In addition to having a higher operating voltage, typically the I/O transistors are more susceptible to ESD as opposed to the core transistors because the former generally isolate the latter from external power effects. ESD occurs due to a relatively short period of relatively high voltage or current imposed on a device. For example, ESD can be caused by the human body, by poorly grounded machinery such as test equipment, or in electrically noisy environments as may be incurred in automotive applications or in consumer applications, including computers. Moreover, various testing has been developed to ensure that certain circuits comply with ESD standards, such as a test circuit mandated by MIL-STD 883B. In any event, due to the risk of ESD, devices are often engineered and tested to ensure that they can withstand certain levels of ESD.

By way of further background to the type of transistors used both in I/O and core locations of prior art circuits, FIG. 1a illustrates a cross-sectional view of a prior art MOS transistor 10 which, by way of example, is an n-channel (NMOS) transistor. Transistor 10 is formed using a substrate 20 which, in the example of FIG. 1a, is formed from a p-type semiconductor material and is therefore labeled with a "P" designation. Two shallow trench isolation ("STI") regions $22_1$, and $22_2$ are formed in substrate 20 and may be various insulating materials such as silicon oxide or silicon nitride. A gate dielectric 24 is formed over substrate 20, and it may be an oxide, a thermally grown silicon dioxide, a nitride, an oxynitride, or a combination of these or other insulators. A gate conductor 26 is formed over gate dielectric 24, such as by forming a layer of material which is patterned and etched to form gate conductor 26. Further, gate conductor 26 is typically formed from polysilicon, although other materials may be used. For the sake of reference, gate conductor 26 is also shown by a schematic indication in FIG. 1a with the identifier "$G_1$." Two lightly doped diffused regions $28_1$ and $28_2$ are formed within substrate 20 and are self-aligned with respect to the sidewalls of gate conductor 26 and also extend slighty under gate conductor 26. In the present example, lightly doped diffused regions $28_1$ and $28_2$ are n-type regions. Thereafter, sidewall insulators $30_1$ and $30_2$ are formed along the sidewalls of gate conductor 26. Next, doped regions $32_1$ and $32_2$ are formed within substrate 20 and are self-aligned with respect to sidewall insulators $30_1$ and $30_2$, respectively. Doped regions $32_1$ and $32_2$ are formed using the same type of conductivity implant as lightly doped diffused regions $28_1$ and $28_2$, but typically with a greater concentration of those dopants and/or using a greater implant energy as compared to that used to form lightly doped diffused regions $28_1$ and $28_2$. Each of doped regions $32_1$ and $32_2$ combines with a corresponding one of lightly doped diffused regions $28_1$ and $28_2$ to form what are generally structurally identical and symmetric regions relative to gate conductor 26; thus, these regions are sometimes referred to as source/drain regions. However, for the sake of reference, in FIG. 1a the combination of region $28_1$ and region $32_1$ is considered to provide the source of transistor 10 and is schematically labeled "$S_1$,", and the combination of region $28_2$ and region $32_2$ is considered to provide the drain of transistor 10 and is schematically labeled "$D_1$."

The operation of transistor 10 is well known in the art and, thus, the following discussion only addresses aspects relating to observations by the present inventors and as improved upon by the preferred embodiments discussed later. Under normal operation, when a proper gate-to-source potential is applied to transistor 10, then current conducts between source $S_1$ and drain $D_1$. As appreciated from FIG. 1a, this current path is between the inward boundaries of lightly doped diffused regions $28_1$ and $28_2$ and below gate dielectric 24, and this area is known as the transistor channel.

To further illustrate the operation of transistor 10 and particularly to illustrate an aspect during an ESD event, FIG. 1b illustrates a plan view of various components of transistor 10. Generally, FIG. 1b illustrates the source $S_1$, gate $G_1$, and drain $D_1$ of transistor 10. Further, the channel spans between two dashed lines, where those lines are intended to illustrate the inward boundaries of lightly doped diffused regions $28_1$ and $28_2$ as they exist below gate $G_1$. Given the location of the channel, current under normal operation travels uniformly in the horizontal dimension relative to FIG. 1b (and FIG. 1a). However, under ESD events, it has been observed that there may be an area of so-called runaway current, that is, a particular physical location within the channel where a considerably greater amount of current passes as opposed to other locations within the channel. Such a physical location is referred to as a "filament" and, for sake of illustration, one such filament is shown by way of a bi-directional arrow designated $F_1$ in FIG. 1b. Moreover, an ESD event may cause damage to transistor 10 because most of the energy passes by way of filament $F_1$, thereby posing the greatest potential for device damage along the path of that filament.

In view of the above, there arises a need to improve upon the prior art as is achieved by the preferred embodiments described below.

BRIEF SUMMARY OF THE INVENTION

In the preferred embodiment, there is a method of forming a transistor in a semiconductor active area. The method forms a gate structure in a fixed relationship to the semiconductor active area thereby defining a first source/drain region adjacent a first structure sidewall and a second source/drain region adjacent a second gate sidewall. The method also forms a lightly doped diffused region formed in the first source/drain region and extending under the gate structure, wherein the lightly doped diffused region comprises a varying resistance in a direction parallel to the gate structure. Other aspects are also disclosed and claimed.

BRIEF DESCRIPTION OF THE SEVERAL VIEWS OF THE DRAWING

FIG. 1b illustrates a plan view of the prior art transistor shown in FIG. 1a.

FIG. 3b illustrates a cross-sectional view of the preferred embodiment transistor of FIG. 3a.

DETAILED DESCRIPTION OF THE INVENTION

Figure 1A:
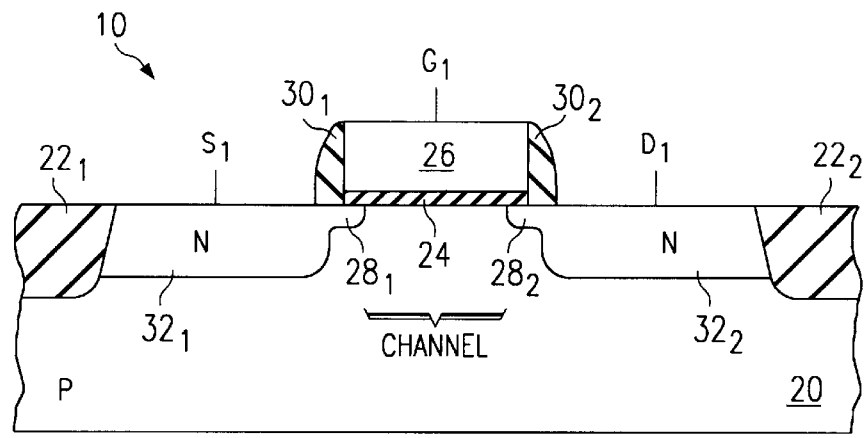
FIG. 1a illustrates a cross-sectional view of a prior art transistor.
Figure 1B:
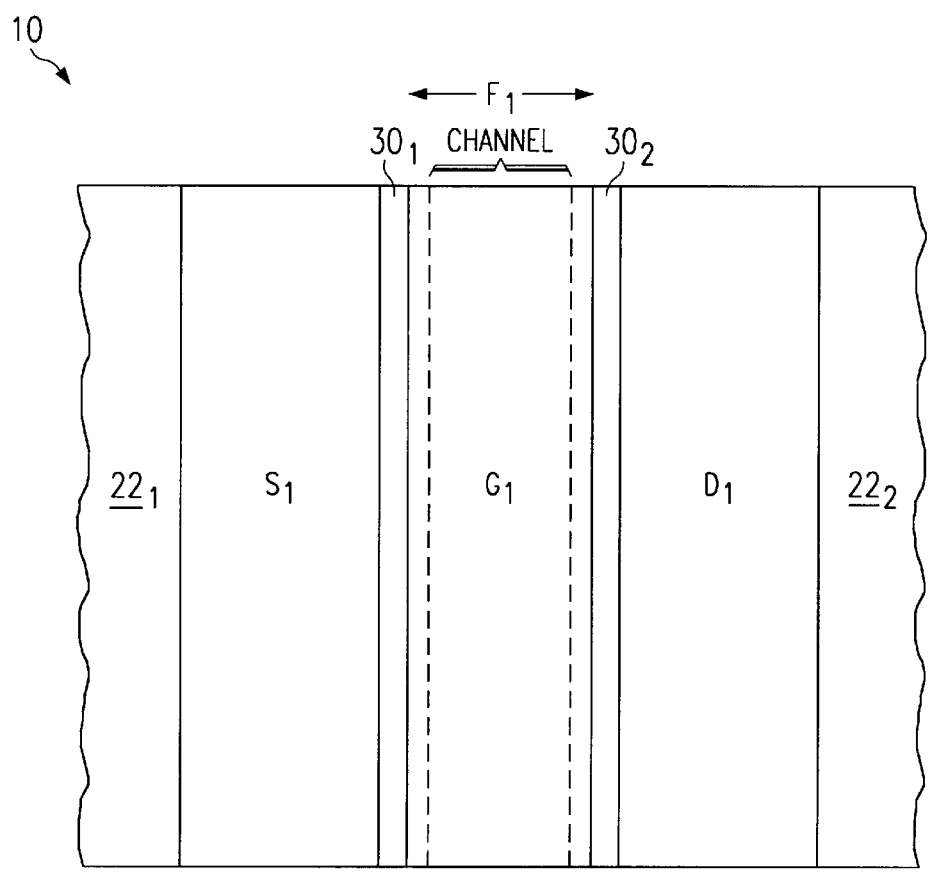

FIGS. 1a and 1b were described above in the Background Of The Invention section of this document and the reader is assumed to be familiar with the principles of that description.

Figure 2:
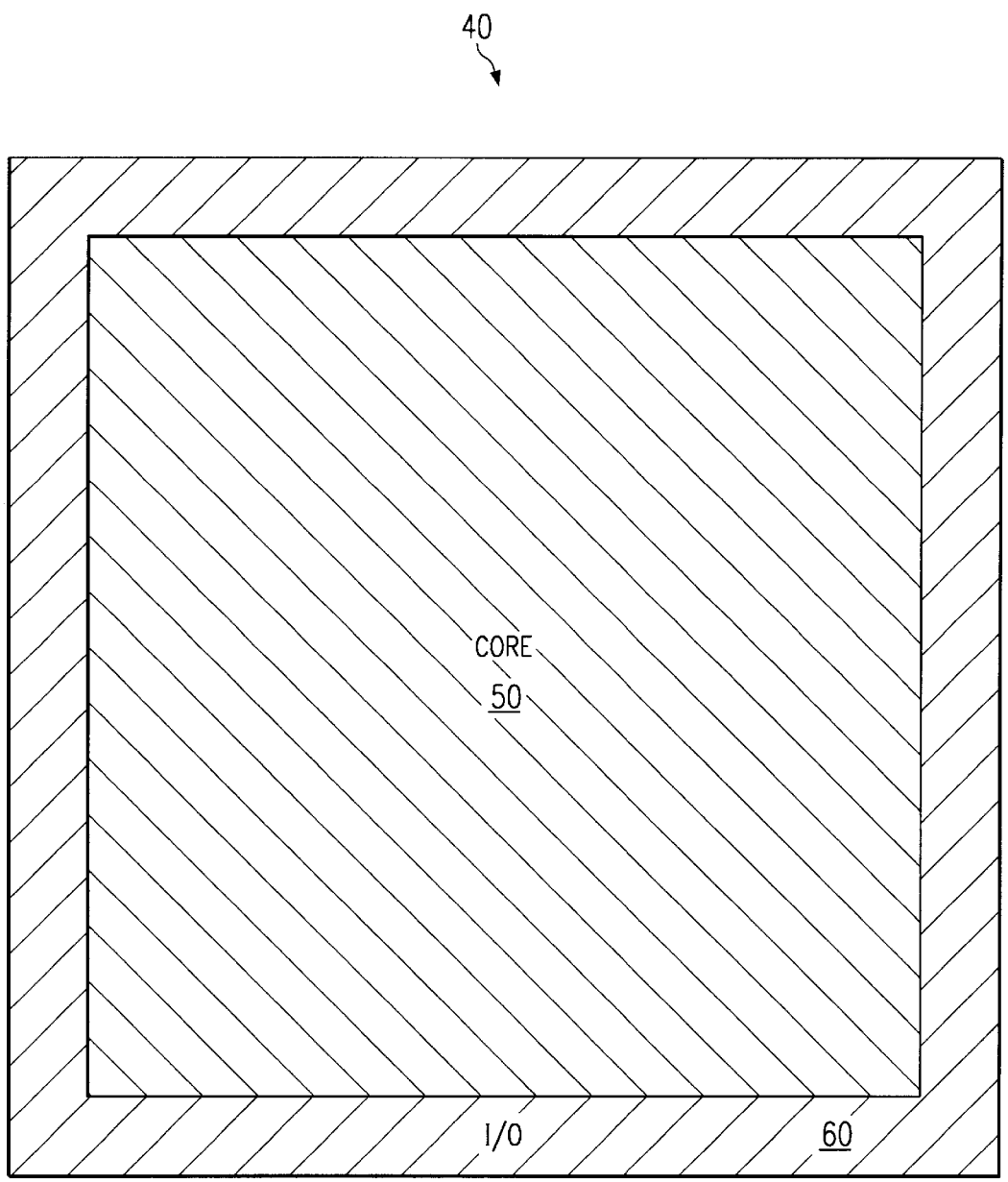
FIG. 2 illustrates a plan view of an integrated circuit having a core circuit and an input/output circuit.

Transistors constructed according to the preferred embodiment may be implemented in various circuits, where one preferred implementation is now introduced in the general plan and block diagram of FIG. 2. FIG. 2 illustrates an integrated circuit 40, where integrated circuit 40 as depicted solely by FIG. 2 is the same as is often implemented in the prior art; however, integrated circuit 40 also may be further improved upon when it implements the particular transistor structure and methodology described with respect to later Figures. Looking now to integrated circuit 40, it includes two general areas of circuitry. A first circuit area is a core 50 and a second circuit area is input/output ("I/O") 60. Various observations about these two circuit areas are helpful to further appreciate the preferred implementation of transistor structure and methodology described below. First, integrated circuit 40 is commonly somewhat symmetric in the layout of I/O 60 around the perimeter of core 50. Second, the area consumed by core 50 circuitry is considerably greater than that consumed by I/O 60 circuitry. For example, the width of a line of circuitry in I/O 60 is often ten percent or less than the width of the circuitry in core 50. Third, often a higher voltage is used for the circuitry within I/O 60 as compared to a lower voltage used for the circuitry within core 50. Each of these observations gives rise to further considerations of the preferred embodiment for transistor configurations as described below.

Figure 3A:
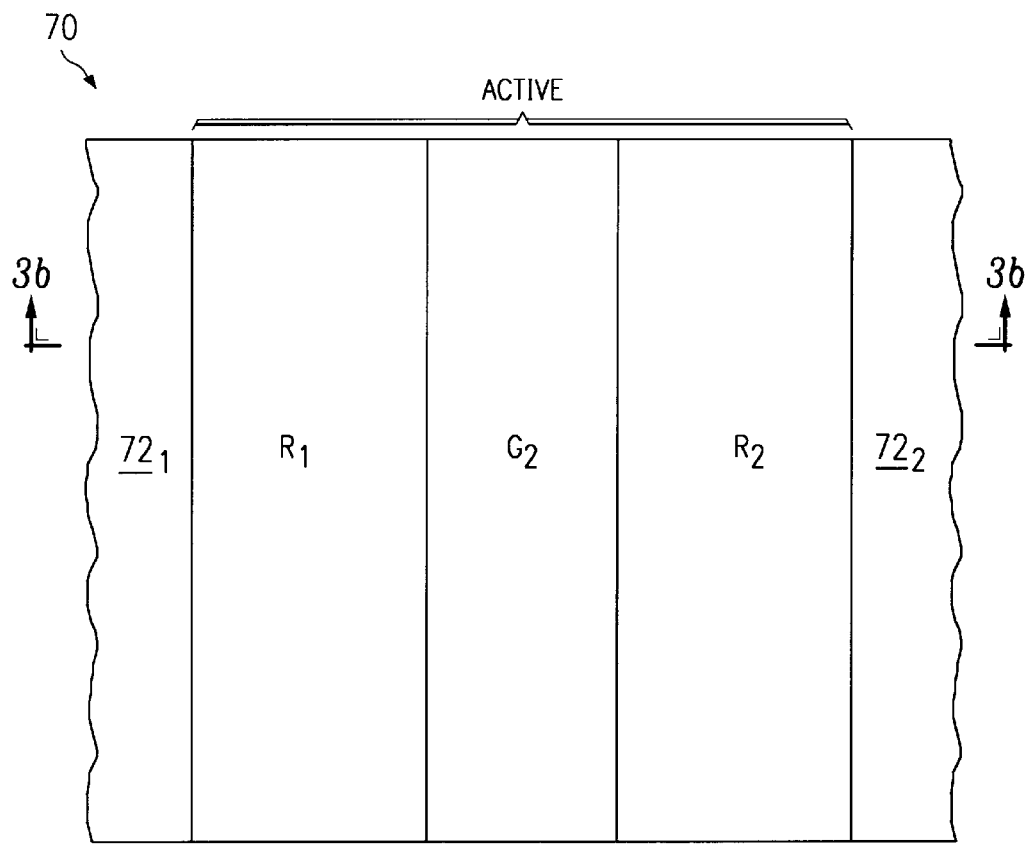
FIG. 3a illustrates a plan view of a first preferred embodiment transistor.
Figure 3B:
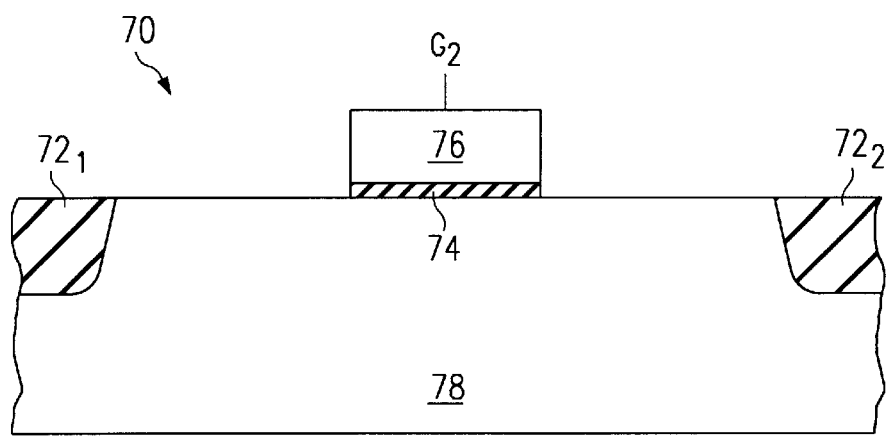

FIG. 3a illustrates a plan view, and FIG. 3b a cross-sectional view, of a transistor 70 according to the preferred embodiment. As further appreciated below, transistor 70 is preferably implemented in I/O 60 of integrated circuit 40, but alternative implementations are also contemplated as within the inventive scope. Turning to FIG. 3a, transistor 70 is formed by defining an active semiconductor area between isolating regions $72_1$ and $72_2$. Regions $72_1$ and $72_2$ may be shallow trench isolation ("STI") regions, yet alternate isolation techniques may be used (e.g., field oxide). As also shown in FIG. 3b, the active region is provided by a semiconductor substrate 78. However, in various configurations, and possibly based on the conductivity type of the transistor (i.e., PMOS or NMOS), then the active area may be provided by a well region (or more than one well region). A gate dielectric 74 is formed over the active area, and it may be an oxide, a thermally grown silicon dioxide, a nitride, an oxynitride, or a combination of these or other insulators. A gate conductor 76 is formed over gate dielectric 74, such as by forming a layer of material which is patterned and etched to form gate conductor 76. Gate conductor 76 is preferably polysilicon, although other materials may be used. For the sake of reference, gate conductor 76 is also shown by a schematic indication in FIGS. 3a and 3b with the identifier "$G_2$." Lastly, as shown in FIG. 3a, the formation of gate $G_2$ generally separates the active region into two exposed regions $R_1$ and $R_2$ adjacent to respective sidewalls of gate $G_2$ and which, as demonstrated below, provide areas in which source/drain regions for the transistor are subsequently formed.

Figure 4A:
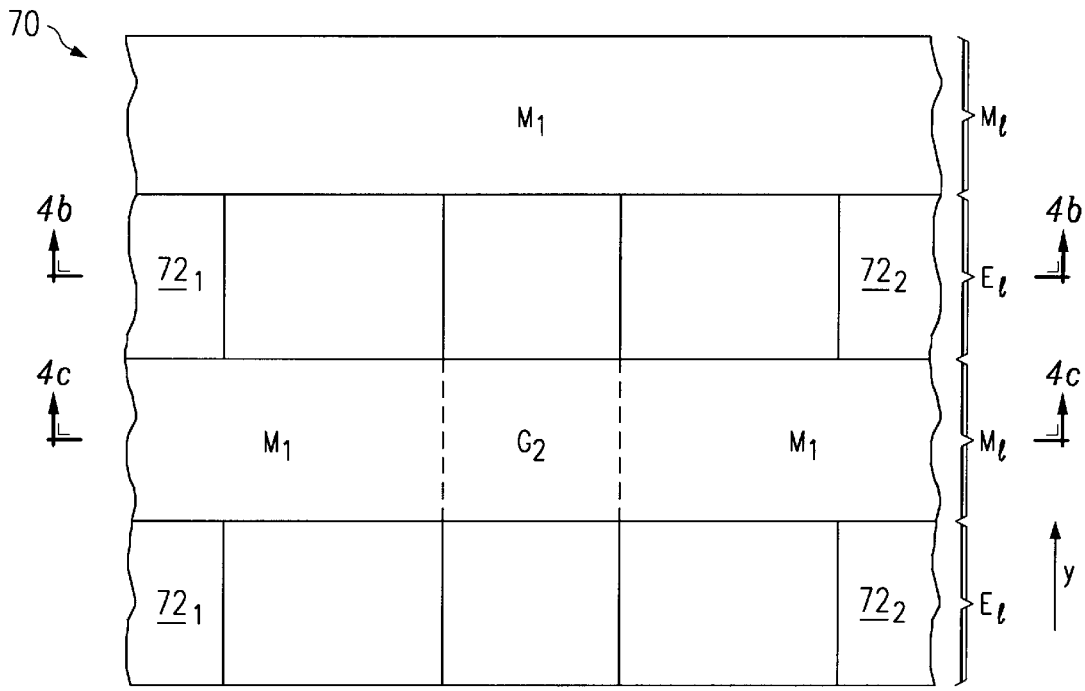
FIG. 4a illustrates a plan view of the first preferred embodiment transistor from FIG. 3a after the application of a mask.
Figure 4B:
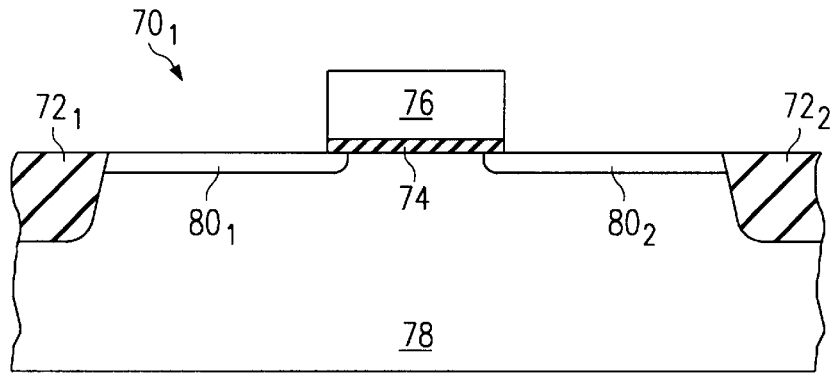
FIG. 4b illustrates a cross-sectional view of the preferred embodiment transistor of FIG. 4a in an unmasked area.
Figure 4C:
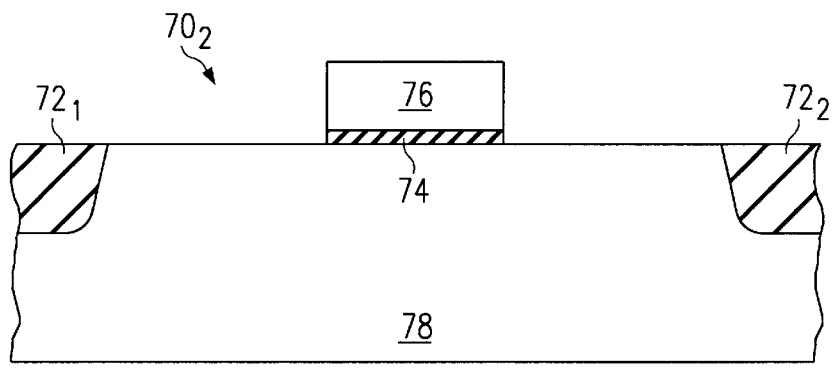
FIG. 4c illustrates a cross-sectional view of the preferred embodiment transistor of FIG. 4a in a masked area.

FIGS. 4a through 4c illustrate selective formation of lightly-doped drain regions according to the preferred embodiment. More particularly, FIG. 4a illustrates the plan view of transistor 70 after a mask $M_1$ is formed over the device, while FIGS. 4b and 4c illustrate cross-sectional views taken along lines 4b and 4c, respectively, in FIG. 4a. In the preferred embodiment, mask $M_1$ may be formed using a standard photoresist process. Turning to FIG. 4a, mask $M_1$ is preferably shaped so that includes like-dimension elements, with each element spanning perpendicular to gate $G_2$ and completely across the active region of transistor 70, where each element preferably spans a same length, $M_l$ in the direction along gate $G_2$. In the example of FIG. 4a, mask $M_1$ includes two such elements, but as explained below in actual implementation a much larger number of elements may be used. As a result of the various elements, mask $M_1$ covers only certain areas of the active region of transistor 70, thereby leaving other areas of that active region exposed. Once mask $M_1$ is in place, a dopant implant is performed so that lightly-doped regions are formed in the exposed active areas. The type of dopant may be selected by one skilled in the art according to the desired conductivity type of the transistor. Thus, for an NMOS transistor the dopant is an n-type dopant, whereas for a PMOS transistor the dopant is a p-type dopant. Note also that the actual energy and concentration of dopants may vary according to different design considerations. Indeed, with the evolution of transistor design in recent years, the concentration levels of prior art lightly doped diffused regions have increased, and this trend also may be realized in the preferred embodiment. In any event, the implant creates two different portions for each source/drain of transistor 70, a first portion which includes the areas that receive the implant (because of a lack of an overlying mask element) and a second portion which includes the areas that do not directly receive the implant (because of an overlying mask element). As detailed below, these two portions therefore have different electrical resistance.

By way of examples to illustrate the effects of mask $M_1$, FIG. 4b illustrates a cross-sectional of view of transistor 70 along an area of active region that is in the first portion created by mask $M_1$, that is, which is uncovered by mask $M_1$ and which for sake of reference is identified as view $70_1$. Since view $70_1$ results from an exposed area, then lightly-doped regions $80_1$ and $80_2$ are formed within the active region, and in the present example they are self-aligned with respect to the sidewalls of gate conductor 76. Moreover, by the nature of the dopant implant, and possibly due to one or more subsequent annealing steps, the dopants diffuse laterally to a certain extent under gate conductor 76. By way of contrast, FIG. 4c illustrates a cross-sectional view of transistor 70 along an area of active region that is in the second portion created by mask $M_1$, that is, which is covered by mask $M_1$ and which for sake of reference is identified as view $70_2$. Due to the coverage by mask $M_1$ in this area, then no lightly-doped regions are formed within the active region shown in FIG. 4c. Given FIGS. 4b and 4c, one skilled in the art should appreciate how these same cross-sections may appear at other cross-sectional locations for transistor 70.

Having described the effect of mask $M_1$ and the general resulting structures in FIGS. 4b and 4c, various additional observations are noteworthy with respect to the preferred embodiment. Specifically, note that the depiction on FIG. 4c of no lightly-doped regions is a simplification when in fact the extent of, or existence of, such regions may depend on three factors: (i) the dimensions of mask $M_1$; (ii) the extent of the lateral diffusion of the dopants within semiconductor substrate 78; and (iii) the precise location of the cross-sectional view. In other words, some masked areas are nonetheless close to the edge of an element of mask $M_1$, so beyond that edge is an exposed area into which dopants are implanted; further, it is expected that some of these dopants implanted in the nearby exposed area will laterally diffuse into the area under the edge of the mask element. As a result, lightly doped diffused regions may be formed to some extent in areas covered by mask $M_1$. However, these lightly doped diffused regions will have a lesser dopant concentration as opposed to those areas of the active region which are completely exposed by virtue of the shape of mask $M_1$.

Figure 5:
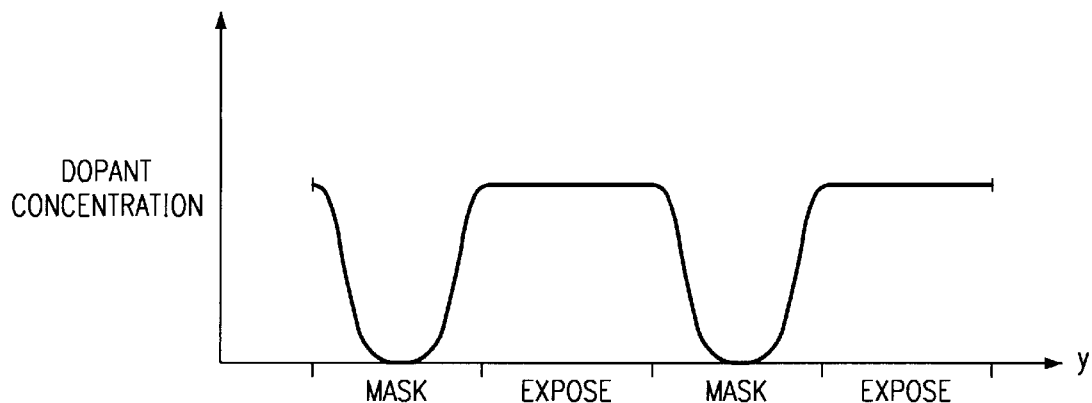
FIG. 5 illustrates a simplified plot of the dopant concentration in the active region of the preferred embodiment transistor from FIGS. 3a through 4c.

To further depict the effect of different dopant concentrations across the active area of transistor 70, FIG. 5 illustrates a simplified plot of the dopant concentration in the active region of transistor 70 and resulting from the implant using mask $M_1$. In FIG. 5, the vertical plot axis depicts dopant concentration while the horizontal axis depicts the y-dimension shown in FIG. 4a. From FIG. 5, therefore, one skilled in the art will appreciate that dopant concentration is at its peak in areas exposed by the mask and then it falls off toward zero in the areas where mask $M_1$ is present. However, a drop all the way to zero will depend on the length of the dimension $M_l$. In other words, one skilled in the art will appreciate that the greater the size of $M_l$, the greater the chance that certain cross-sections taken perpendicular to gate $G_2$ may have little or no lightly doped diffused regions, with the latter being illustrated in FIG. 4c. Alternatively, however, to ensure some of the benefit of a lightly doped diffused region, in the preferred embodiment, two aspects are endeavored to occur with mask $M_1$. First, the dimension $M_l$ is reduced to as small as possible given the available technology (e.g., 0.2 micron under contemporary processes). Indeed, with such a reduced size, note that the number of mask elements may be much greater than two as shown in FIG. 4a, as depending on the total length of the active area in the dimension along gate $G_2$. Second, the dimension $M_l$ is selected so that the exposed length between each portion of mask $M_1$, shown as the dimension $E_l$ in FIG. 4a, is the same as the dimension $M_l$. Thus, a symmetry is maintained as between the masked areas and the unmasked (i.e., exposed) areas of the active area. Given these attributes, the resulting structure of transistor 70 may be pictured to include numerous slices (taken in the dimension perpendicular to gate $G_2$), wherein the concentration of the lightly doped diffused region of each slice formed in an area underlying mask $M_1$ will differ only slightly from the immediately adjacent slice when examined in the direction along (i.e., parallel to) the gate conductor, thereby creating a gradient of dopant concentration in these slices. As a result, in a general sense, even the masked slices will include to some extent a pair of lightly doped diffused regions as shown in FIG. 4b, but the source/drain resistance for such slices will be greater than those slices which are formed in the active areas left exposed by mask $M_1$. In all events, however, the dopant concentration in the unmasked areas will be greater than the zero or non-zero dopant concentration in the masked areas. Moreover, for a masked source/drain region, the dopant concentration taken along the lightly doped diffused portion of that region will vary when examined in the direction along (i.e., parallel to) the gate conductor. Thus, along a line that extends through the masked and unmasked portions of transistor 70, a varying resistance occurs in the source/drain in the direction parallel to the gate conductor.

Figure 6A:
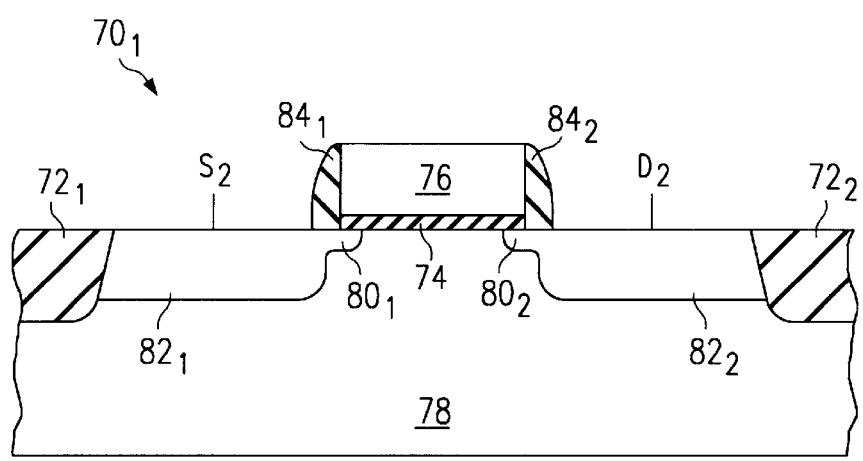
FIG. 6a illustrates a cross-sectional view $70_1$ following FIG. 4b once the mask is removed and additional processing steps are taken.
Figure 6B:
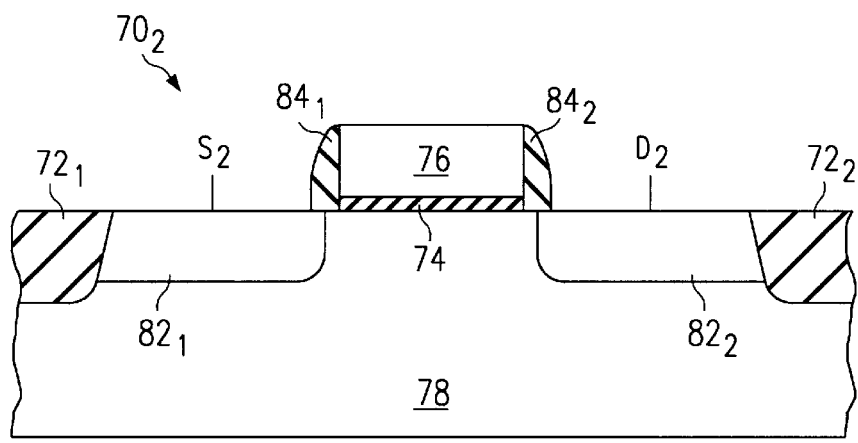
FIG. 6b illustrates a cross-sectional view $70_2$ following FIG. 4c once the mask is removed and additional processing steps are taken.

FIGS. 6a and 6b illustrate cross-sectional views $70_1$ and $70_2$ from FIGS. 4b and 4c, respectively, after additional processing steps which occur once mask $M_1$ is removed. First, in both FIGS. 6a and 6b, insulating sidewalls $84_1$ and $84_2$ are formed along the sidewalls of gate conductor 76, and these sidewalls are constructed according to techniques known in the art. For example, an insulating layer may be formed overlying transistor 70, and that layer is then etched to form insulating sidewalls $84_1$ and $84_2$. Next, a second dopant implant step is performed. As a result, doped regions $82_1$ and $82_2$ are formed within substrate 78, and they are self-aligned with respect to insulating sidewalls $84_1$ and $84_2$, respectively. In FIG. 6a, therefore, the combination of doped region $82_1$ and lightly doped diffused region $80_1$ forms the transistor source in view $70_1$ and is schematically labeled $S_2$, while the combination of doped region $82_2$ and lightly doped diffused region $80_2$ forms the transistor drain in view $70_1$ and is schematically labeled $D_2$. In contrast, in FIG. 6b, since no lightly doped diffused regions were formed (assuming a relatively large value of $M_l$), then regions $82_1$ and $82_2$ alone form source $S_2$ and drain $D_2$, respectively. Finally, while not shown, various additional components may be connected to or formed in connection with transistor 70 as may be ascertainable by one skilled in the art.

Having detailed a preferred embodiment for transistor 70, attention is now returned to its effect in connection with EDS protection. First, recall that preferably transistor 70 is implemented as part of I/O 60. Second, in the preferred embodiment, the same doping step used to create the varying lightly doped diffused regions in the transistors of I/O 60 is also used to form lightly doped diffused regions for transistors in core 50; however, for the core transistors they preferably are constructed using a standard lightly doped diffused region process without a mask that partially exposes their active regions (i.e., like mask $M_1$) and, thus, the core transistors include uniform doping concentration in their lightly doped diffused regions as depicted in FIG. 1a. Comparatively speaking, therefore, the transistors of I/O 60 have, as demonstrated in FIGS. 5 and 6a and 6b, a varying source/drain resistance due to the gradient of dopant concentration that occurs in the locations of lightly doped diffused regions, whereas the transistors of core 50 have a uniform or non-varying source/drain resistance due to the uniform doping concentrations in their lightly doped diffused regions. Moreover, as between the transistors of I/O 60 and the transistors of core 50, the lightly doped diffused region gradient of the former gives rise to a larger overall effective source/drain resistance as compared to the source/drain resistance of the latter. As a result, the transistors of I/O 60 are more resistant to ESD as compared to the transistors of core 50. In other words, the relatively greater source/drain resistance of the transistors of I/O 60 reduces the chance of runaway current occurring across a filament in those transistors during an ESD event. Further, note that this increased resistance is achieved efficiently in that the same lightly doped diffused region step is used for both core 50 and I/O 60, that is, without adding a separate doping step for the relatively fewer number of transistors of I/O 60 compared to the larger number of transistors of core 50. Instead, the difference in the respective lightly doped diffused region resistance as between I/O 60 and core 50 is achieved by implementing a mask that selectively exposes the transistor active regions as depicted by mask $M_1$.

Figure 7A:
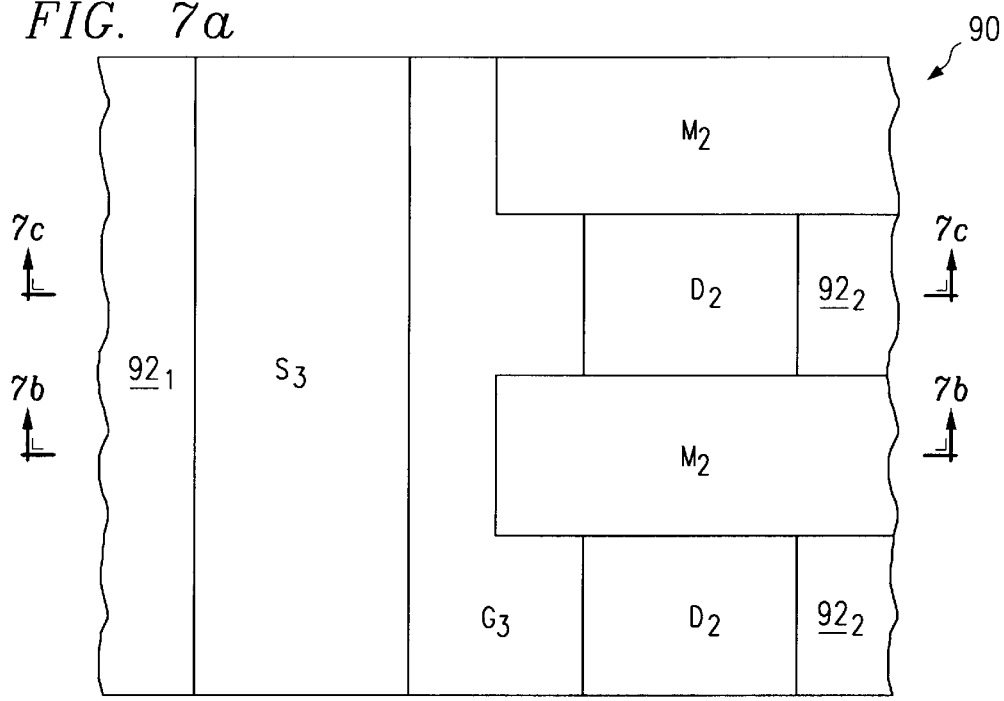
FIG. 7a illustrates a plan view of a second preferred embodiment transistor after the application of an alternative mask.
Figure 7B:
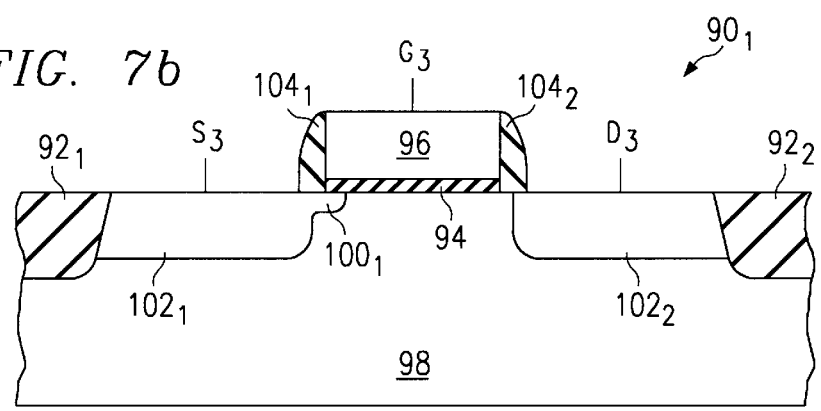
FIG. 7b illustrates a cross-sectional view of the preferred embodiment transistor of FIG. 7a in a masked area.
Figure 7C:
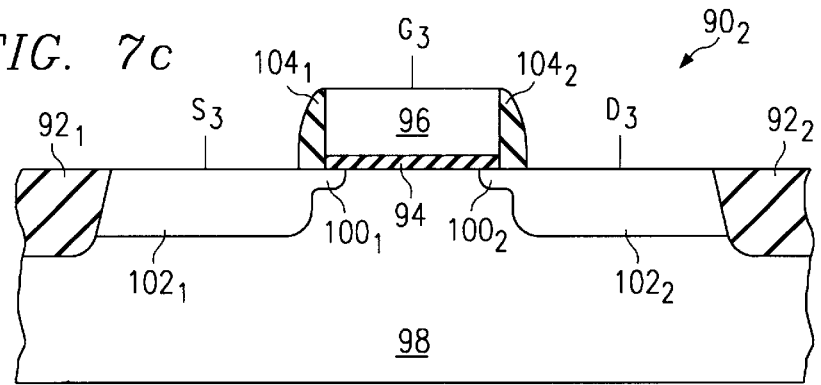
FIG. 7c illustrates a cross-sectional view of the preferred embodiment transistor of FIG. 7a in an unmasked area.

FIGS. 7a through 7c illustrate an alternative embodiment of a transistor 90, again which is preferably implemented to form the transistors in I/O 60. More particularly, FIG. 7a illustrates a plan view of transistor 90 after a mask $M_2$ is formed over the device, while FIGS. 7b and 7c illustrate cross-sectional views taken along line 7b and line 7c, respectively, in FIG. 7a, and after a few additional processing steps. Generally, transistor 90 is comparable in many respects to transistor 70 described above and, thus, those common aspects are not detailed again having been discussed earlier. Looking therefore to the difference between transistor 70 and transistor 90, it arises in that mask $M_2$ is identical to mask $M_1$ (i.e., with selective openings) with respect to the drain of transistor 90, but mask $M_2$ does not cover the source of transistor 90.

As a result of the difference in mask $M_2$, for cross-sections taken perpendicular to the gate $G_3$ and where mask $M_2$ is applied such as shown by example as transistor view $90_1$ of FIG. 7b, then the source includes a lightly doped diffused region while the drain does not. More particularly, looking to FIG. 7b, it illustrates a semiconductor substrate 98 with an active region defined between isolating regions $92_1$ and $92_2$, and with a gate conductor 96 separated from substrate 98 by a gate dielectric 94. After gate conductor 96 is formed, a first doping step occurs with mask $M_2$ in place and thereby forms lightly doped diffused region $100_1$ as shown on the source side of transistor view $90_1$, but no symmetrical region is formed on the drain side of transistor view $90_1$ because it is covered by mask $M_2$. Thereafter, mask $M_2$ is removed, insulating sidewalls $104_1$ and $104_2$ are formed, and a second doping step is performed to create doped regions $102_1$ and $102_2$. Consequently, source $S_3$ of transistor view $90_1$ includes both doped region $102_1$ as well as lightly doped diffused region $100_1$, while drain $D_3$ of transistor view $90_1$ includes only a doped region $102_2$.

As a result of the difference in mask $M_2$ versus mask $M_1$, for cross-sections taken perpendicular to the gate $G_3$ and where mask $M_2$ leaves the active area exposed as shown by example as transistor view $90_2$ of FIG. 7c, then both the source and drain include a lightly doped diffused region. More particularly, looking to FIG. 7c, it illustrates that once gate conductor 96 is formed, the first doping step in connection with mask $M_2$ forms lightly doped diffused regions $100_1$ and $100_2$ which are self-aligned to opposite sidewalls of gate conductor 96. Thereafter, the second doping step creates doped regions $102_1$ and $102_2$, but in view $90_2$ each of those regions combines with a respective lightly doped diffused region $100_1$ and $100_2$, thereby providing source $S_3$ and drain $D_3$, respectively.

Having illustrated the alternative transistor 90 embodiment of FIGS. 7a through 7c, note that various considerations may arise in implementing this embodiment versus transistor 70 described above. First, it is recognized that forming mask $M_2$ in a controlled manner to fully expose the transistor source while selectively exposing the transistor drain will prove complex, particularly for smaller lengths of $M_l$. Second, however, a net benefit nevertheless may be achieved in certain circuit configurations. Specifically, for various circuit implementations, the source and drain of a transistor may be connected so that the potential on either may swing as may the direction of current between the two and, hence, in these cases each region may be considered in some instances a source and in other instances a drain. As such, these regions may be more generally referred to as source/drain regions. However, in other implementations, a source may be connected to a fixed potential whereas the drain is connected to a switching potential. In these and possibly other implementations, the current capacity of the transistor is much more limited if the source potential is increased as opposed to increasing the drain potential. Accordingly, to avoid increasing the source potential, transistor 90 may be used in such implementations whereby the effective drain resistance is increased due to the selective openings of mask $M_2$ over part of the active region in which the drain is formed, whereas the source resistance (and, hence, source potential) is unaffected by mask $M_2$ because it does not cover the active region in which the source is formed.

From the above, it may be appreciated that the above embodiments provide a MOS transistor with enhanced ESD protection. Moreover, while the present embodiments have been described in detail, various substitutions, modifications or alterations could be made to the descriptions set forth above without departing from the inventive scope. Indeed, numerous examples have been provided above, and still others will be ascertainable by one skilled in the art. Accordingly, all of the above considerations should reflect upon the inventive scope, which is defined by the following claims.

What is claimed is:

1. A method of forming a transistor in a semiconductor active area, comprising:

forming a gate structure in a fixed relationship to the semiconductor active area thereby defining a first source drain region adjacent to a first edge of said gate structure and a second source drain region adjacent to a second edge of said gate structure wherein said second edge of said gate is opposite said first edge of said gate;

forming a mask over a first portion of said first source drain region and over a first portion of said second source drain region;

implanting first dopants into a second portion of said first source drain region and into a second portion of said second source drain region wherein said second portion of said first source drain region and said second portion of said second source drain region are not covered by said mask and said first portion and said second portion are adjacent to said gate;

removing said mask; and implanting second dopants into said first source drain region and into said second source drain region.

2. The method of claim 1 wherein said implanting said first dopants forms lightly doped regions.

3. The method of claim 2 further comprising:

forming a first sidewall adjacent said first edge of said gate structure; and respectively; and forming a second sidewall adjacent said second edge of gate structure.

4. A method of forming a transistor in a semiconductor active area, comprising:

forming a gate structure in a fixed relationship to the semiconductor active area thereby defining a first source drain region adjacent to a first edge of said gate structure and a second source drain region adjacent to a second edge of said gate structure wherein said second edge of said gate is opposite said first edge of said gate;

forming a mask over a first portion of said first source drain region;

implanting first dopants into a second portion of said first source drain region and into second source drain region wherein said second portion of said first source drain region is not covered by said mask and said first portion and said second portion are adjacent to said gate;

removing said mask; and implanting second dopants into said first source drain region and into said second source drain region.

5. The method of claim 4 wherein said implanting said first dopants forms lightly doped regions.

6. The method of claim further comprising:

forming a first sidewall adjacent said first edge of said gate structure; and forming a second sidewall adjacent said second edge of said gate structure.

* * * * *